(12) United States Patent
Lee

(10) Patent No.: US 7,282,978 B2
(45) Date of Patent: *Oct. 16, 2007

(54) DUTY CYCLE CORRECTION DEVICE

(75) Inventor: Hyun Woo Lee, Kyoungki-do (KR)

(73) Assignee: Hynix Semiconducter Inc., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/477,884

(22) Filed: Jun. 29, 2006

(65) Prior Publication Data

US 2007/0001726 A1    Jan. 4, 2007

(30) Foreign Application Priority Data

Jun. 30, 2005    (KR) ............... 10-2005-0058093

(51) Int. Cl.
*H03K 3/017* (2006.01)
*H03K 5/04* (2006.01)
*H03K 7/08* (2006.01)

(52) U.S. Cl. ..................... 327/175; 327/172

(58) Field of Classification Search ........ 327/175–176, 327/172, 165–166, 144
See application file for complete search history.

(56) References Cited

U.S. PATENT DOCUMENTS

| | | | |
|---|---|---|---|
| 5,945,857 A * | 8/1999 | Havens | 327/175 |
| 6,525,581 B1 | 2/2003 | Choi | |
| 6,853,225 B2 | 2/2005 | Lee | |
| 7,015,739 B2 * | 3/2006 | Lee et al. | 327/175 |
| 7,116,149 B2 * | 10/2006 | Kim | 327/175 |
| 2003/0117194 A1 * | 6/2003 | Lee | 327/158 |
| 2004/0066873 A1 | 4/2004 | Cho et al. | |
| 2005/0184779 A1 | 8/2005 | Yoo et al. | |

FOREIGN PATENT DOCUMENTS

| | | |
|---|---|---|
| JP | 10-150350 | 6/1998 |
| JP | 2003-168280 | 6/2003 |
| JP | 2004-129255 | 4/2004 |

* cited by examiner

*Primary Examiner*—Linh My Nguyen
*Assistant Examiner*—Patrick O'Neill
(74) *Attorney, Agent, or Firm*—Ladas & Parry LLP

(57) ABSTRACT

Enclosed is a duty cycle correction device for correcting a duty cycle of a clock signal output from a delay locked loop (DLL) device by using a phase mixer. The duty cycle correction device comprises: a mixer for receiving a first clock signal and a second clock signal and outputting a first signal; a phase splitter for receiving the first signal and outputting a third clock signal by delaying the first signal and a fourth clock signal by delaying and inverting the first signal; a duty detection unit for receiving the third and fourth clock signals and detecting a difference between their duty cycles; a combination unit for outputting a second signal; and a shift register for outputting a control signal to adjust a mixing ratio of the first and second clock signals in response to the second signal.

10 Claims, 6 Drawing Sheets

| ME1 | ME2 | ME3 | ME4 | ME5 | ME6 | ME7 | ME8 | ME1 | ME2 | ME3 | ME4 | ME5 | ME6 | ME7 | ME8 |
|---|---|---|---|---|---|---|---|---|---|---|---|---|---|---|---|
| 1 | 1 | 1 | 1 | 1 | 1 | 1 | 1 | 0 | 0 | 0 | 0 | 0 | 0 | 0 | 0 |

| ME1 | ME2 | ME3 | ME4 | ME5 | ME6 | ME7 | ME8 | ME1 | ME2 | ME3 | ME4 | ME5 | ME6 | ME7 | ME8 |
|---|---|---|---|---|---|---|---|---|---|---|---|---|---|---|---|
| 0 | 1 | 1 | 1 | 1 | 1 | 1 | 1 | 1 | 0 | 0 | 0 | 0 | 0 | 0 | 0 |

| ME1 | ME2 | ME3 | ME4 | ME5 | ME6 | ME7 | ME8 | ME1 | ME2 | ME3 | ME4 | ME5 | ME6 | ME7 | ME8 |
|---|---|---|---|---|---|---|---|---|---|---|---|---|---|---|---|
| 0 | 0 | 1 | 1 | 1 | 1 | 1 | 1 | 1 | 1 | 0 | 0 | 0 | 0 | 0 | 0 |

FIG.6D

| | 201~208 IN FIG.2 | | | | | | | | 211~218 IN FIG.2 | | | | | | | |
|---|---|---|---|---|---|---|---|---|---|---|---|---|---|---|---|
| ME1 | ME2 | ME3 | ME4 | ME5 | ME6 | ME7 | ME8 | ME1 | ME2 | ME3 | ME4 | ME5 | ME6 | ME7 | ME8 |
| 0 | 1 | 1 | 1 | 1 | 1 | 1 | 1 | 1 | 0 | 0 | 0 | 0 | 0 | 0 | 0 |

FIG.6E

| | 201~208 IN FIG.2 | | | | | | | | 211~218 IN FIG.2 | | | | | | | |
|---|---|---|---|---|---|---|---|---|---|---|---|---|---|---|---|
| ME1 | ME2 | ME3 | ME4 | ME5 | ME6 | ME7 | ME8 | ME1 | ME2 | ME3 | ME4 | ME5 | ME6 | ME7 | ME8 |
| 0 | 0 | 0 | 0 | 1 | 1 | 1 | 1 | 1 | 1 | 1 | 1 | 0 | 0 | 0 | 0 |

DUTY CYCLE CORRECTION DEVICE

BACKGROUND OF THE INVENTION

1. Field of the Invention

The present invention relates to a duty cycle correction device used in a semiconductor memory chip, and more particularly to a duty cycle correction device for correcting a duty cycle of a clock signal output from a delay locked loop (DLL) device by using a phase mixer.

2. Description of the Prior Art

As generally known in the art, a DLL device is a clock generating device, which is accommodated in a synchronous memory device so as to compensate for skew between an external clock and an internal clock. Synchronous memory devices, such as DDR, DDR2, etc., control the timing for input/output operations in synchronization with an internal clock output from a DLL device. In the case of these synchronous memory devices, since data are input/output in synchronization with the rising and falling edges of an external clock, it is preferred that the duty cycle of an internal clock output from a DLL device is set as 50% if possible. Therefore, in order to adjust the duty cycle of an internal clock output from the DLL device to be approximately 50%, a duty cycle correction (DCC) device employing a delay circuit or the like is typically used.

However, the conventional DCC device, which employs a delay circuit or the like in order to adjust the duty cycle of an internal clock output from a DLL device, has a problem in that the correcting ability for the duty cycle is very poor.

SUMMARY OF THE INVENTION

Accordingly, the present invention has been made to solve the above-mentioned problem occurring in the prior art, and an object of the present invention is to provide a duty cycle correction device capable of generating clock signals having a duty cycle of 50%, by mixing the phases of two clock signals output from a delay locked loop (DLL) circuit by means of a phase mixing unit and feedback controlling the phase mixing unit using the mixed result.

In order to accomplish this object, there is provided a duty cycle correction device comprising: a mixer for receiving a first clock signal and a second clock signal, and mixing phases of the first and second clock signals, thereby outputting a first signal; a phase splitter for receiving the first signal, and outputting a third clock signal by delaying the first signal for a predetermined period of time and a fourth clock signal by delaying and inverting the first signal for a predetermined period of time; a duty detection unit for receiving the third and fourth clock signals, and detecting a difference between duty cycles of the third and fourth clock signals; a combination unit for outputting a second signal, by combining an output signal of the duty detection unit and previously-stored output signals; and a shift register for outputting a control signal to adjust a mixing ratio of the first and second clock signals, which are applied to the mixer, in response to the second signal.

In accordance with another aspect of the present invention, a rising edge of the first clock signal is synchronized with a rising edge of the second clock signal.

In accordance with still another aspect of the present invention, the mixer comprises: a first inverter group having N inverters, which are connected in parallel between a first node and a second node; a second inverter group having N inverters, which are connected in parallel between a third node and the second node; a buffer means connected between the second node and a fourth node, wherein the first clock signal is applied to the first node; the second clock signal is applied to the third node; the first signal is output through the fourth node; and a part of inverters included in the first and second inverter groups are enabled or disabled by the control signal output from the shift register, thereby adjusting the mixing ratio of the first and second clock signals.

In accordance with still another aspect of the present invention, the phase splitter comprises: an even number of inverters connected in serial to each other, so as to receive the first signal and to output the third clock signal by delaying the received first signal for a predetermined period of time; and an odd number of inverters connected in serial to each other, so as to receive the first signal and to output the fourth clock signal by delaying the received first signal for a predetermined period of time.

In accordance with still another aspect of the present invention, the duty detection unit detects a difference between a high-level section of the third clock signal and a high-level section of the fourth clock signal.

BRIEF DESCRIPTION OF THE DRAWINGS

The above and other objects, features and advantages of the present invention will be more apparent from the following detailed description taken in conjunction with the accompanying drawings, in which:

FIGS. 6A to 6E are views for explaining the operation of the shift register.

DETAILED DESCRIPTION OF THE PREFERRED EMBODIMENTS

Figure 1A:
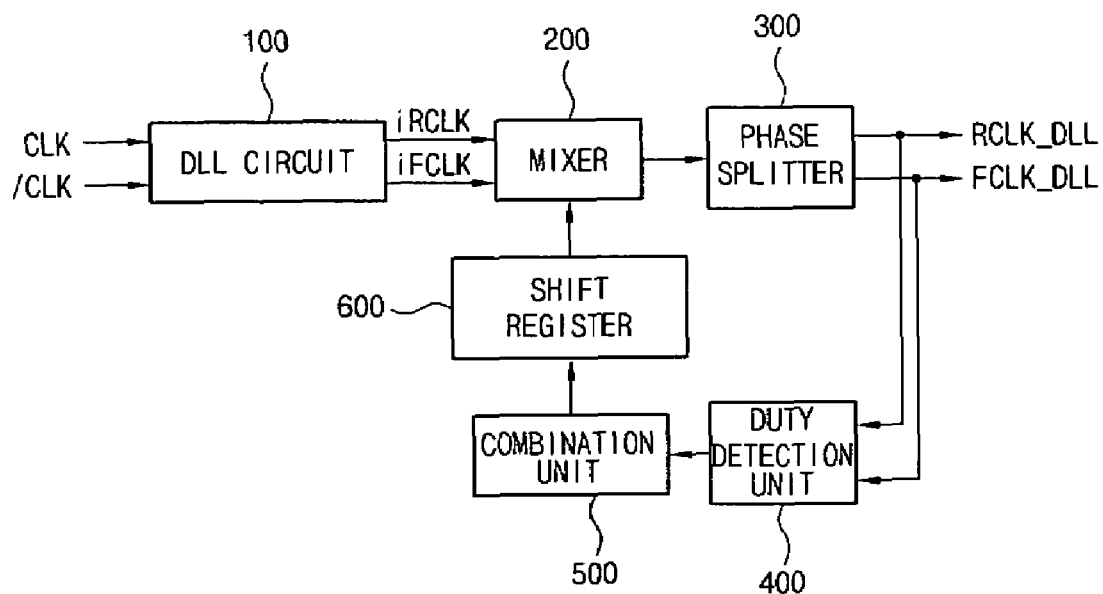
FIG. 1A is a block diagram illustrating the construction of a duty cycle correction device according to an embodiment of the present invention.

Hereinafter, a preferred embodiment of the present invention will be described with reference to the accompanying drawings. In the following description and drawings, the same reference numerals are used to designate the same or similar components, so repetition of the description on the same or similar components will be omitted.

FIG. 1A is a block diagram illustrating the construction of a duty cycle correction device according to an embodiment of the present invention.

As shown in FIG. 1A, the duty cycle correction device includes a mixer 200, a phase splitter 300, a duty detection unit 400, a combination unit 500, and a shift register 600. The mixer 200 receives signals "iRCLK" and "iFCLK" output from a delay locked loop (DLL) circuit 100. The phase splitter 300 receives an output signal of the mixer 200, and outputs signals "RCLK_DLL" and "FCLK_DLL" having a corrected duty-cycle. The duty detection unit 400 detects the duty cycles of the signals "RCLK_DLL" and "FCLK_DLL" output from the phase splitter 300. The combination unit 500 receives an output signal of the duty detection unit 400, and combines distortion in a phase. The shift register 600 controls a mixing degree of the mixer 200 in response to an output signal of the combination unit 500.

Figure 1B:
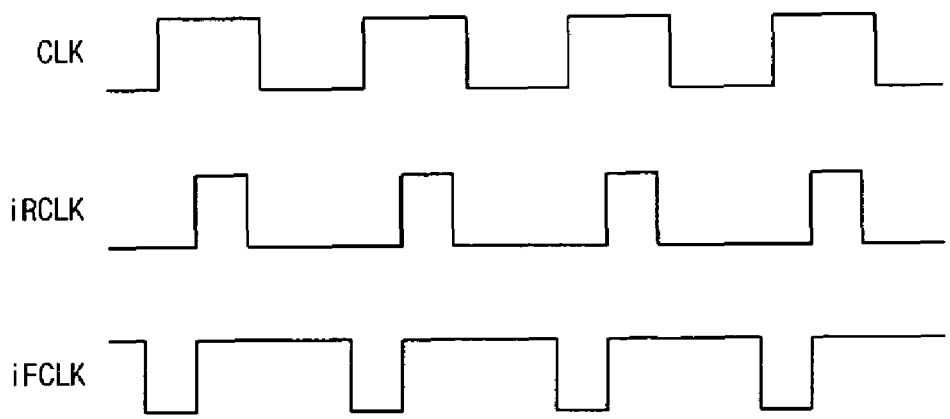
FIG. 1B is a waveform view for signals shown in FIG. 1A.

The DLL circuit 100 receives external clocks "CLK" and "/CLK" and outputs internal clocks "iRCLK" and "iFCLK". Herein, it is necessary to pay attention to the waveform of a signal output from the DLL circuit 100. The internal clock "iRCLK" is a clock signal synchronized with the rising edge of the external clock "CLK". The internal clock "iFCLK" is a clock signal having a different duty cycle from the internal clock "iRCLK", and is synchronized with the rising edge of the external clock "CLK". For reference, FIG. 1B is a waveform view illustrating the output signals of the DLL circuit 100. Therefore, the duty cycle correction device of the present invention may be applied to every case of receiving two input signals, whose rising edges are synchronized with each other but whose duty cycles are different.

Figure 2:
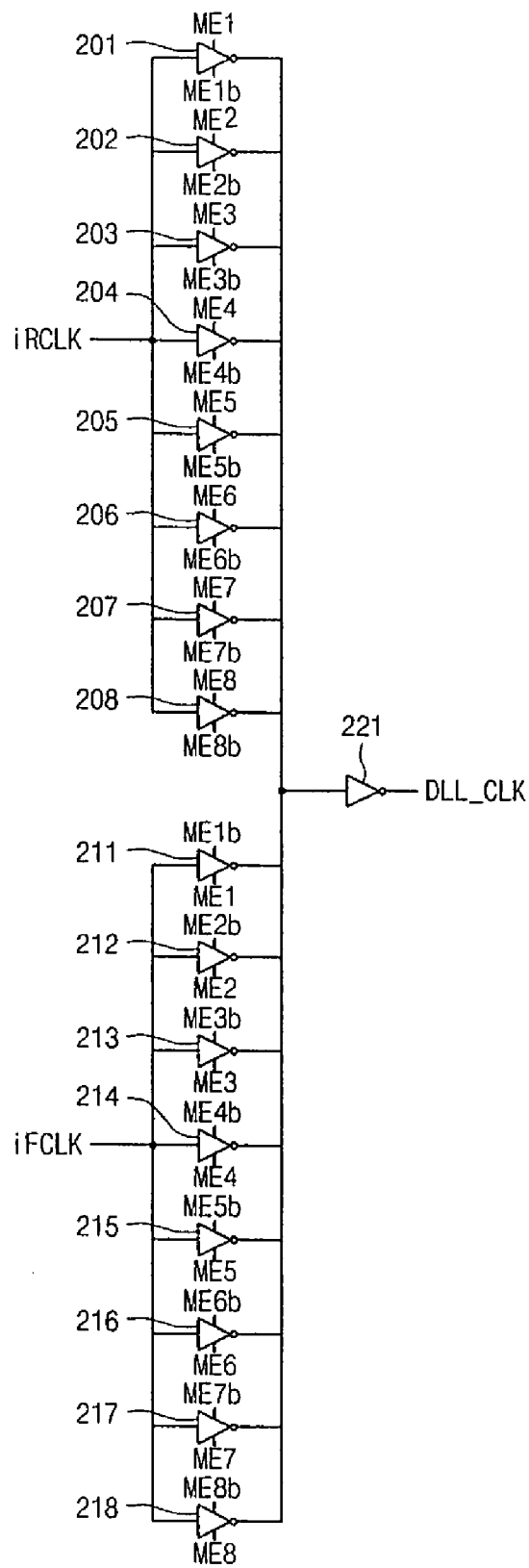
FIG. 2 is a circuit diagram illustrating the construction of a mixer according to an embodiment of the present invention.

The mixer 200 receives two internal clocks "iRCLK" and "iFCLK", and outputs one clock signal having a medial phase of the received internal clocks. FIG. 2 is a circuit diagram illustrating the construction of the mixer according to an embodiment of the present invention.

As shown in FIG. 2, the mixer includes N inverters 201 to 208 (herein, "N" is eight) for receiving the internal clock "iRCLK" in common, N inverters 211 to 218 for receiving the internal clock "iFCLK" in common, and an inverter 221 for receiving all output signals of the inverters 201 to 208, and 211 to 218. Herein, the input terminals of the inverters 201 to 208 are connected in common, the input terminals of the inverters 211 to 218 are connected in common, and the output terminals of the inverters 201 to 208, and 211 to 218 are connected in common. The output signal "DLL_CLK" of the inverter 221 is applied to a phase splitter shown in FIG. 3.

In operation, the phases of clock signals "iRCLK" and "iFCLK" applied to the mixer can be mixed, by selectively turning on/off the inverters 201 to 208, and 211 to 218 by means of control signals "ME1", "ME1b", "ME2", "ME2b", . . . , "ME8", and "ME8b" applied to the inverters 201 to 208, and 211 to 218. The degree of mixing can be controlled by adjusting the number of inverters turned-on/off. Herein, control signals "ME1b", "ME2b", . . . , and "ME8b" represent the inverse signals of control signals "ME1", "ME2", . . . , and "ME8". As described later in this document, the control signals "ME1", "ME1b", "ME2", "ME2b", . . . , "ME8", and "ME8b" represents output signals of the shift register.

Figure 3:
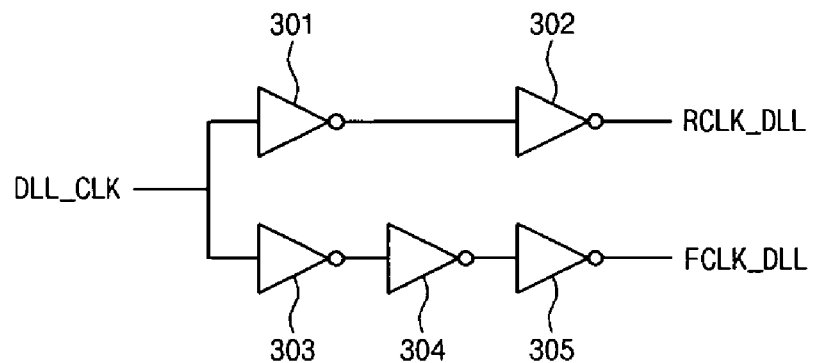
FIG. 3 is a circuit diagram illustrating the construction of a phase splitter according to an embodiment of the present invention.

The phase splitter 300 is a circuit, which receives and buffers an output signal of the mixer 200, and then outputs a clock signal having a duty cycle of 50% that is suitable for use in a memory device. FIG. 3 is a circuit diagram illustrating the construction of a phase splitter according to an embodiment of the present invention. Referring to FIG. 3, the phase splitter includes a first buffer 301 and 302 having an even number of inverters, and a second buffer 303, 304, and 305 having an odd number of inverters. As shown in FIG. 3, the output signal "RCLK_DLL" of the first buffer 301 and 302 is obtained by delaying an input signal "DLL_CLK" during a predetermined period of time, and the output signal "FCLK_DLL" of the second buffer 303, 304, and 305 is obtained by inverting and delaying the input signal "DLL_CLK" during a predetermined period of time.

For reference, the amount of delay time taken until the input signal "DLL_CLK" passes through the first buffer 301 and 302 is equal to the amount of delay time taken until the input signal "DLL_CLK" passes through the second buffer 303, 304, and 305.

Figure 4:
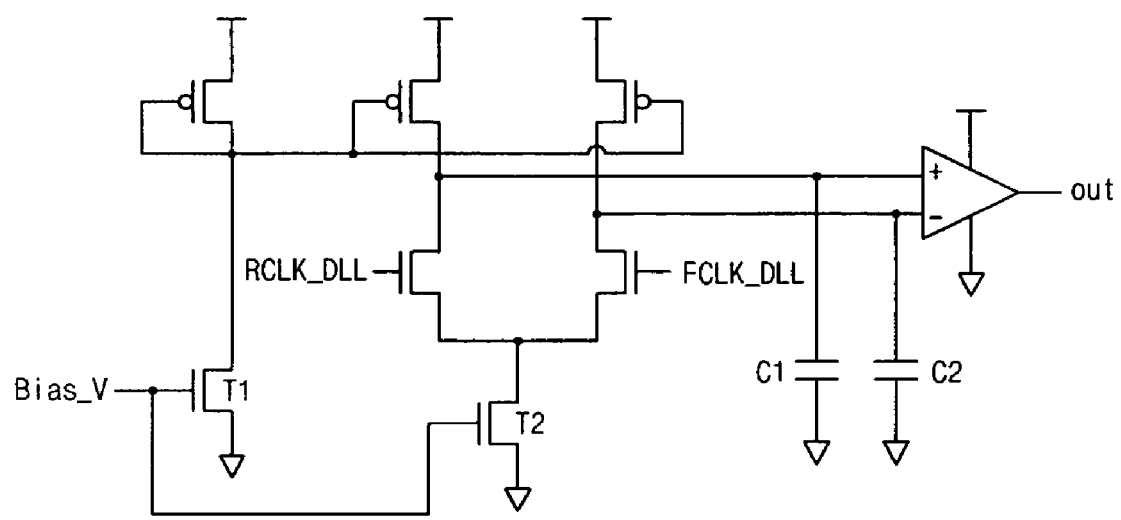
FIG. 4 is a circuit diagram illustrating the construction of a duty detection unit according to an embodiment of the present invention.
Figure 5:
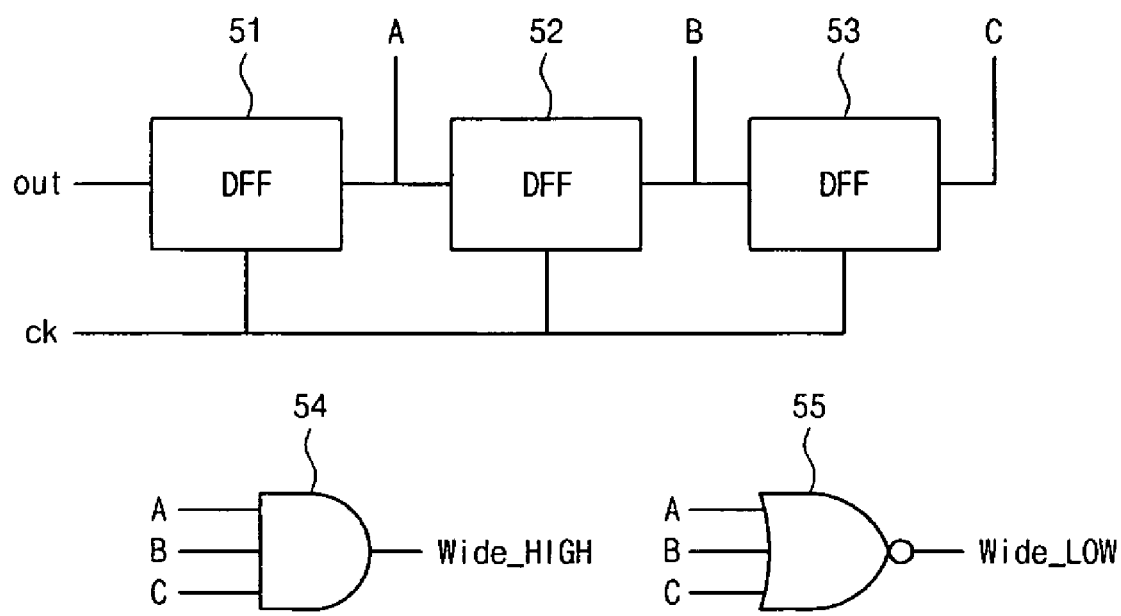
FIG. 5 is a circuit diagram illustrating the construction of a combination unit according to an embodiment of the present invention.

The duty detection unit 400 detects a phase difference between the two output signals "RCLK_DLL" and "FCLK_DLL" of the phase splitter 300. FIG. 4 is a circuit diagram illustrating the construction of the duty detection unit 400 according to an embodiment of the present invention. As shown in FIG. 4, the duty detection unit 400 includes a differential amplifier for receiving the signals "RCLK_DLL" and "FCLK_DLL", capacitors C1 and C2 for storing output signals of the differential amplifier, and an OP amplifier for amplifying a voltage difference between the capacitors C1 and C2. For reference, a signal "Bias_V" is used to turn on transistors T1 and T2 in order to utilize the transistors T1 and T2 as resistance components. That is, each turned-on transistor T1 or T2 serves as a resistance component.

In operation, the amount of charge stored in the capacitors C1 and C2 are changed depending on the widths of high level sections of the output signals "RCLK_DLL" and "FCLK_DLL" of the phase splitter 300 (for reference, it is preferred that the capacitors C1 and C2 have the same size). The difference in the amount of charge results in a difference in an input voltage applied to the OP amplifier. Therefore, the OP amplifier amplifies the voltage difference, thereby determining which one of two input signals "RCLK_DLL" and "FCLK_DLL" has a wider high-level section. For example, when the two input signals "RCLK_DLL" and "FCLK_DLL" have the same duty cycle, the almost same amount of charge is stored in the capacitors C1 and C2. In contrast, when the two input signals "RCLK_DLL" and "FCLK_DLL" have duty cycles different from each other, the amount of charge stored in the capacitors C1 and C2 becomes different from each other. The OP amplifier senses a difference in the amount of charge of the capacitors C1 and C2, which are connected to input terminals of the OP amplifier, respectively, thereby detecting a difference in duty cycles of the input signals "RCLK_DLL" and "FCLK_DLL".

The combination unit 500 includes three D flip-flops 51, 52, and 53, an AND gate 54, and a NOR gate 55. The D flip-flop 51 receives an output signal "out" of the duty detection unit 400, the D flip-flop 52 receives an output signal "A" of the D flip-flop 51, and the D flip-flop 53 receives an output signal "B" of the D flip-flop 52. The AND gate 54 receives the output signals "A", "B", and "C" of the D flip-flops 51, 52, and 53, and the NOR gate 55 receives the output signals "A", "B", and "C" of the D flip-flops 51, 52, and 53. A clock signal "CK" applied to the D flip-flops 51, 52, and 53 is an enable signal for the D flip-flops 51, 52, and 53. For reference, when the AND gate 54 outputs a high-level signal, the shift register performs a shifting operation in the right or left direction. In contrast, when the AND gate 54 outputs a low-level signal, the shift register does not performs the shifting operation. Also, when the NOR gate 55 outputs a low-level signal, the shift register is maintained in a current state. In contrast, the NOR gate 55 outputs a high-level signal, the shift register performs a shifting operation. In this case, the shifting direction of the shift register is opposite to the shifting direction of the shift register caused by an output signal of the AND gate. For instance, if the AND gate controls a shift-left operation, the NOR gate controls a shift-right operation.

In operation, initially, the output signals "A", "B", and "C" of the D flip-flops 51, 52, and 53 have values of "L", "L", and "L". Therefore, the output signal of the AND gate 54 has a low level, and the output signal of the NOR gate 55 has a high level. The logic values of the shift register, shown in FIG. 6A, are shifted in the right direction.

When a high-level signal "H" is applied to the combination unit from the duty detection unit, the output signals "A", "B", and "C" of the D flip-flops 51, 52, and 53 are changed to "H", "L", and "L". Accordingly, the output signal of the AND gate has a low level, and the output signal of the NOR gate also has a low level, so that the current state is maintained (FIG. 6B).

Next, when a high-level signal "H" is applied to the combination unit from the duty detection unit, the output signals "A", "B", and "C" of the D flip-flops 51, 52, and 53 are changed to "H", "H", and "L". Accordingly, the output signal of the AND gate has a low level, and the output signal of the NOR gate also has a low level, so that the current state is maintained (FIG. 6B).

Next, when a high-level signal "H" is applied to the combination unit from the duty detection unit, the output signals "A", "B", and "C" of the D flip-flops 51, 52, and 53 are changed to "H", "H", and "H". Accordingly, the output signal of the AND gate has a high level, and the output signal of the NOR gate also has a low level, so that a shift-left operation is performed.

FIGS. 6A to 6E are views for explaining the operation of the shift register 600, which has an 8-bit resolution according to an embodiment of the present invention. In FIGS. 6A to 6E, 8 left bits represent control signals applied to the inverters 201 to 208 shown in FIG. 2, and 8 right bits represent control signals applied to the inverters 211 to 218 shown in FIG. 2.

FIG. 6A shows an initial state, FIG. 6B shows a state after the shift-right operation is performed one time, and FIG. 6C shows a state after the shift-right operation is performed one more time. FIG. 6D shows a state after the shift-left operation is performed one time, and FIG. 6E shows a state after the shift-right operation is performed three times. For reference, when the shift-left operation is performed at the initial state shown in FIG. 6A, all values are shifted in the left direction, and a value of "1" is applied to the most right bit. That is, the number of "1"representing a high level and the number of "0" representing a low level are always maintained as eight (8 bits), respectively.

In operation, initially, by the control signals having values shown in FIG. 6A, the inverters 201 to 208 shown in FIG. 2 are maintained in turned-on state, and the inverters 211 to 218 are maintained in turned-off state. Thereafter, the shifting operation is performed according to signals applied from the combination unit, and values changed by the shifting operation are used to selectively turn on/off the inverters 201 to 208, and 211 to 218. That is, the inverters of the mixer shown in FIG. 2 can be selectively turned on/off according to logic values of the shift register. Therefore, it is possible to adjust a mixing ratio of signals "iRCLK" and "iFCLK" applied to the mixer.

When a mixing ratio close to the optimum state is set by output signals of the shift register, the output signal "DCC_CLK" of the mixer 200 has a duty cycle of approximately 50%. Therefore, the output signals "RCLK_DLL" and "FCLK_DLL" of the phase splitter 300 also have a duty cycle of approximately 50%. Although the output signals "RCLK_DLL" and "FCLK_DLL" have a duty cycle of approximately 50%, the duty detection unit 400 outputs an output signal "out" having either a high level or a low level.

Accordingly, the shift register performs either a shift-right operation or a shift-left operation, depending on the output signal of the combination unit 500. The mixing ratio of the mixer is re-adjusted according to the operation of the shift register, and the above-mentioned procedure is continuously repeated.

As described above, according to the duty cycle correction device of the present invention, it is possible to precisely output a signal having the duty cycle required by the user.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A duty cycle correction device comprising:
    a mixer receiving a first clock signal and a second clock signal, and mixing phases of the first and second clock signals according to a digital control signal having logic, thereby outputting a first signal;
    a phase splitter receiving the first signal, and outputting a third clock signal by delaying the first signal for a predetermined period of time and a fourth clock signal by delaying and inverting the first signal for a predetermined period of time;
    a duty detection unit receiving the third and fourth clock signals, and detecting a difference between duty cycles of the third and fourth clock signals;
    a combination unit outputting a second signal, by combining an output signal of the duty detection unit and previously-stored output signals; and
    a shift register generating the digital control signal having the logic values corresponding to a logical level of the second signal and outputting the digital control signal to adjust a mixing ratio of the first and second clock signals, which are applied to the mixer, in response to the first and second clock signal.

2. The duty cycle correction device of claim 1, wherein a rising edge of the first clock signal is synchronized with a rising edge of the second clock signal.

3. The duty cycle correction device of claim 1, wherein the mixer comprises:
    a first inverter group having N inverters, which are connected in parallel between a first node and a second node;
    a second inverter group having N inverters, which are connected in parallel between a third node and the second node;
    a buffer means connected between the second node and a fourth node, wherein
    the first clock signal is applied to the first node;
    the second clock signal is applied to the third node;
    the first signal is output through the fourth node; and
    a part of inverters included in the first and second inverter groups are enabled or disabled by the digital control signal output from the shift register, thereby adjusting the mixing ratio of the first and second clock signals.

4. The duty cycle correction device of claim 1, wherein the phase splitter comprises:
    an even number of inverters connected in serial to each other, so as to receive the first signal and to output the third clock signal by delaying the received first signal for a predetermined period of time; and
    an odd number of inverters connected in serial to each other, so as to receive the first signal and to output the fourth clock signal by delaying and inverting the received first signal for a predetermined period of time.

5. The duty cycle correction device of claim 1, wherein the duty detection unit detects a difference between a high-level section of the third clock signal and a high-level section of the fourth clock signal.

6. A duty cycle correction device comprising:
a mixer receiving a first clock signal and a second clock signal, and mixing phases of the first and second clock signals according to a digital control signal having logic values, thereby outputting a first signal;
an output circuit receiving the first signal, and outputting a third clock signal by delaying the first signal for a predetermined period of time and a fourth clock signal by delaying and inverting the first signal for a predetermined period of time;
a duty detection unit receiving the third and fourth clock signals of the output circuit, and detecting a difference between duty cycles of the third and fourth clock signals;
a combination unit outputting a second signal, by combining an output signal of the duty detection unit and previously-stored output signals; and
a shift register generating the digital control signal having the logic values corresponding to a logical level of the second signal and outputting the digital control signal to adjust a mixing ratio of the first and second clock signals.

7. The duty cycle correction device of claim 6, wherein a rising edge of the first clock signal is synchronized with a rising edge of the second clock signal.

8. The duty cycle correction device of claim 6, wherein the mixer comprises: a first inverter group having N inverters, which are connected in parallel between a first node and a second node;
a second inverter group having N inverters, which are connected in parallel between a third node and the second node; and
a buffer means connected between the second node and a fourth node; wherein
the first clock signal is applied to the first node,
the second clock signal is applied to the third node,
the first signal is output through the fourth node, and
a part of inverters including the first and second inverter groups are enabled or disabled by the digital control signal output from the shift register, thereby adjusting the mixing ratio of the first and second clock signals.

9. The duty cycle correction device of claim 6, wherein the output circuit comprises:
an even number of inverters connected in serial to each other, so as to receive the first signal and to output the third clock signal by delaying the received first signal for a predetermined period of time; and
an odd number of inverters connected in serial to each other, so as to receive the first signal and to output the fourth clock signal by delaying and inverting the received first signal for a predetermined period of time.

10. The duty cycle correction device of claim 6, wherein the duty detection unit detects a difference between a high-level section of the third clock signal and a high-level section of the fourth clock signal.

* * * * *